(12) United States Patent
Song et al.

(10) Patent No.: US 6,835,319 B2
(45) Date of Patent: Dec. 28, 2004

(54) METHOD OF PATTERNING A SUBSTRATE

(75) Inventors: Wen Dong Song, Singapore (SG); Minghui Hong, Singapore (SG); Yong Feng Lu, Singapore (SG)

(73) Assignee: Data Storage Institute, Singapore (SG)

( * ) Notice: Subject to any disclaimer, the term of this patent is extended or adjusted under 35 U.S.C. 154(b) by 108 days.

(21) Appl. No.: 10/078,382

(22) Filed: Feb. 21, 2002

(65) Prior Publication Data

US 2003/0080089 A1 May 1, 2003

(30) Foreign Application Priority Data

Oct. 25, 2001 (SG) ........................................ 200106587

(51) Int. Cl.$^7$ ............................................ H01L 21/302
(52) U.S. Cl. .................... 216/94; 216/101; 219/121.69; 438/745; 438/746
(58) Field of Search .............. 216/94, 101; 219/121.69; 438/745, 746

(56) References Cited

U.S. PATENT DOCUMENTS

| | | | | |
|---|---|---|---|---|
| 4,413,020 A | * | 11/1983 | McKee et al. ............... | 427/555 |
| 5,057,184 A | * | 10/1991 | Gupta et al. .................. | 216/65 |
| 5,460,687 A | * | 10/1995 | Douglas ....................... | 216/48 |
| 6,037,270 A | * | 3/2000 | Kageyama et al. ......... | 438/746 |
| 6,177,358 B1 | * | 1/2001 | Douglas ..................... | 438/746 |
| 6,627,846 B1 | * | 9/2003 | Yogev et al. .......... | 219/121.85 |

FOREIGN PATENT DOCUMENTS

| | | | | |
|---|---|---|---|---|
| JP | 59178189 A | * | 10/1984 | ........... B23K/26/00 |
| JP | 59225896 A | * | 12/1984 | ........... B23K/26/12 |
| JP | 62-240186 | | 10/1987 | |
| JP | 08-010970 | | 1/1996 | |
| JP | 10193162 A | * | 7/1998 | ........... B23K/26/18 |
| JP | 2000-277550 | | 10/2000 | |

OTHER PUBLICATIONS

High–Speed, Maskless Laser Patterning of Indium Tin Oxide Thin Films, O. Yavas et al., Applied Physics Letters, vol. 73, No. 18, Nov. 2, 1998, pp. 2558–2560.
Effect of Substrate Absorption on the Efficiency of Laser Patterning of Indium Tin Oxide Thin Films, O. Yavas et al., Journal of Applied Physics, vol. 85, No. 8, Apr. 15, 1999, pp. 4207–4212.
Substrate–Assisted Laser Patterning of Indium Tin Oxide Thin Films, O. Yavas et al., Appl. Phys. A69, S875–S878, Jul. 1999.
Laser–Induced Etching of Polycrystalline $Al_2O_3$ TiC in KOH Aqueous Solution, Lu et al., Appl. Phys, pp. 43–49, received Mar. 6, 1995, Accepted Jun. 26, 1995.
Efficient Pulsed Laser Removal of 0.2 $\mu$m Sized Particles from a Solid Surface, Appl. Phys. Letter, vol. 58, No. 20, May 20, 1991, W. Zapka et al.
Laser–Assisted Micron Scale Particle Removal, Appl. Phys. Lett., vol. 58, No. 2, Jan. 14, 1991, Imen et al., pp. 203–205.
Laser–Cleaning Techniques for Removal of Surface Particulates, J. Appl. Phys., vol. 71, No. 7, Apr. 1, 1992, Tam et al., pp. 3515–3523.

* cited by examiner

*Primary Examiner*—Anita Alanko
(74) *Attorney, Agent, or Firm*—Nixon & Vanderhye P.C.

(57) ABSTRACT

A method of patterning a substrate includes forming a liquid film on the substrate surface and directing laser energy from a laser through the film to etch the substrate surface. Etched material is carried away from the substrate surface via evaporation of the film during the etching. The liquid film may be formed on the substrate surface by jetting a liquid vapor onto the substrate.

16 Claims, 6 Drawing Sheets

300

400

METHOD OF PATTERNING A SUBSTRATE

FIELD OF THE INVENTION

The invention relates to a method of patterning a substrate. In particular, the invention concerns a method of patterning an Indium-Tin Oxide (ITO) film substrate.

BACKGROUND

Substrates are frequently used in many electronic and telecommunication devices, such as computer chips and mobile phones. Substrates can be made from conductors, semiconductors, superconductors and/or insulators, and the composition of the substrate is usually determined for their suitability for a particular application. For example, ITO has a high electrical conductivity and good optical transparency. These properties make ITO highly suitable for use as transparent conducting electrodes in flat-panel displays, organic light-emitting diodes, and solar cells. ITO may also be used as a sensor for detecting toxic gases. Such applications of substrates usually involve etching into the substrate a desired pattern required for a particular application.

Several methods have been proposed for etching substrates, including ITO film substrates.

A method of etching an ITO layer on a substrate is proposed in U.S. Pat. No. 3,979,240. A photoresist corresponding to the desired pattern is laid on the ITO layer to cover or "mask" portions of the ITO layer. The substrate is then immersed in a concentrated solution of hydrobromic acid to etch the unmasked ITO. Another method is proposed in U.S. Pat. No. 5,171,401. A plasma containing methyl radial can effectively etch the ITO film substrate. Selective ion reactive etching is also proposed in U.S. Pat. No. 5,138,664. These methods suffer from the use of certain solutions and/or gases which are harmful to both users and the environment.

Laser etching of substrates has also been proposed because laser etching does not require photolithography, harmful solutions or gases. One method of laser etching proposed is "dry laser etching" where the surface of the substrate is ablated directly by a laser to pattern the substrate. Dry laser etching is described in several articles, including Yavas O. et al, *High-Speed Maskless Laser Patterning of Indium Tin Oxide Thin Films*, (1998) Appl. Phys. Lett. Vol. 73, No. 18, pp. 2558–2560; Yavas, O. et al, *Effect of Substrate Absorption on the Efficiency of Laser Patterning of Indium Tin Oxide Thin Films*, (1999) J. Appl. Phys. Vol. 85, No. 5, pp. 4207–4212, and Yavas, O. et al, *Substrate-assisted Laser Patterning of Indium Tin Oxide Thin Films*, (1999) Appl. Phys. A69 (suppl.), s875–s878. As discussed in the first referenced article, dry laser etching has the disadvantage that shoulder-like structures are formed at the rim of the laser irradiated spot. The formation of shoulder-like structures can be attributed to the surface tension gradient in the molten material near the rim.

Another laser etching method is proposed in U.S. Pat. No. 5,057,184 and Lu, Y. F. et al, *Laser-Induced Etching of Polycrystalline $Al_2O_3$ TiC in KOH Aqueous Solution*, (1996) Appln Phys. A62, pp. 43–49. This method is called "wet laser etching" as the substrate is immersed either in an inert liquid or, in an aqueous alkaline or acid solution.

In the case of wet etching with an inert liquid, laser-induced sonic cavitation of the inert liquid is used to etch the substrate surface. However, wet laser etching using an inert liquid is limited by the need for the substrate to have suitable physical properties for this wet etching method. That is, for the substrate can be effectively etched, the substrate must be able to absorb the laser energy, have a finite melting temperature and must not sublime when being subjected to heat from the laser energy.

In the case of wet etching with an aqueous alkaline or acid solution, a laser-induced chemical reaction is used to etch the substrate surface. The disadvantage of this wet etching method is that material may be etched at inappropriate locations, even at room temperature.

In addition, both wet etching methods result in residue or contaminants from the etching process remaining in the solution, and so can be potentially re-deposited on the substrate, causing an undesirable etched pattern.

Furthermore, a method of laser cleaning an etched substrate has been proposed in Zapka, W. et al, *Efficient Pulsed Laser Removal of 0.2 $\mu m$ sized particles from a Solid Surface*, (1991) Appl. Phys. Lett. Vol. 58 No. 20, pp. 2217–2219; Imen, K. et al, *Laser-Assisted Micron Scale Particle Removal* (1990), Appl. Phys. Lett. Vol. 58 No. 2. pp. 203–205, and Tam, A. C. et al, *Laser-Cleaning Techniques for Removal of Surface Particulates*, (1992) J. Appl. Phys. Vol 71 No. 7, pp. 3515–3523. These references propose a steam laser cleaning method. A laser is used to irradiate a contaminated substrate with a liquid film deposited on the surface so that the film evaporates to carry away particulate contaminants from the substrate and does not involve ablating or etching the substrate surface. Laser fluence and the number of pulses must be deliberately minimised in the method to prevent any damage to the substrate. In addition, the function of the liquid film is to enhance cleaning efficiency of this method.

SUMMARY

The present invention provides a method of patterning a substrate according to a predetermined path, said method including forming a liquid film on the substrate surface and directing laser energy from a laser through the film to etch the substrate surface, wherein etched material is carried away from the substrate surface via evaporation of the film during said etching.

With the present invention, the formation of shoulder-like structures at the rim of the laser-irradiated spot can be effectively avoided, the etching rate is greatly enhanced, and the etched materials can be carried away to prevent possible re-deposition on the substrate. In particular, the laser energy induces sonic cavitation of the liquid film to etch the substrate. Thus, etching and patterning quality can be greatly improved by the method of the invention In the context of this specification, the term "liquid film" means a relatively thin layer of liquid with a thickness of micrometer scale.

After laser patterning, the liquid film is evaporated. A dry substrate with a desired pattern can be observed.

Preferably, the liquid film is formed on the substrate surface by jetting a liquid vapour onto the substrate surface. The liquid vapour is preferably composed of water, alcohol, inert liquid or non-reactive liquid. In a preferred embodiment, the liquid film has a thickness of from several micrometers to several tens of micrometers.

It is preferred that the liquid vapour is jetted with a gas to carry the liquid vapour onto the substrate surface. The gas is preferably composed of nitrogen, compressed air, oxygen or an inert gas.

Preferably, the laser energy is directed in pulses of predetermined duration. The pulses preferably are in the range of 1–100 ns.

Preferably, the laser fluence energy is more than the etching threshold of the substrate. In a preferred embodiment, the range of laser fluence energy is more than 150 mJ/cm$^2$.

BRIEF DESCRIPTION OF THE DRAWINGS

Preferred embodiments of the invention will now be described, by way of example only, with reference to the drawings, in which:

FIG. 2b is a depth profile of FIG. 2a;

FIG. 3b is a depth profile of FIG. 3a;

FIG. 4b is a depth profile of FIG. 4a;

FIG. 5b is a depth profile of FIG. 5a;

DETAILED DESCRIPTION

Figure 1:
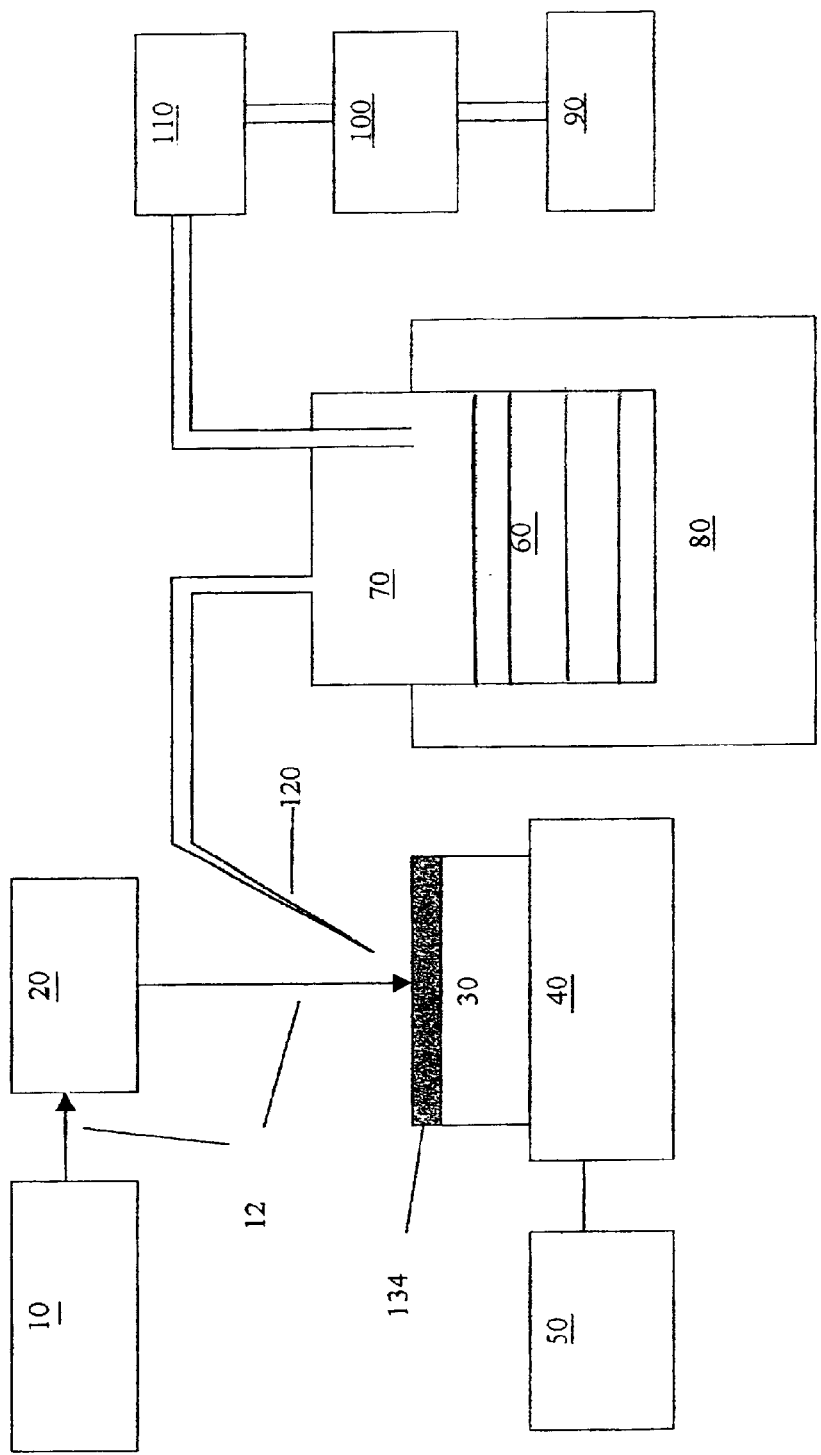
FIG. 1 is a schematic diagram illustrating the method according to one embodiment of the present invention.

FIG. 1 shows an apparatus for applying a preferred embodiment of the method of the present invention. A laser 10 for generating a laser beam 12 is provided with an optical system 20. The laser 10 can be a YAG laser or Excimer laser. An optical system 20 scans the laser beam 12 onto a substrate 30 along a predetermined path. Optical system 20 includes a mirror, lens and galvanometric mirror. Optical system 20 can change the direction and focus of laser beam 12 as well as scanning laser beam on substrate 30, and is preferably computer controlled. The substrate 30 is placed on a carrying stage 40, such as an X-Y stage, which is also capable of moving along a predetermined path. A controller 50 controls the direction and speed of stage 40.

A container 70 is provided having a liquid 60 and is heated by a heater 80 to generate liquid vapour. The liquid may be water, alcohol or any other suitable liquid. A gas source 90 is in communication with container 70 via gas flow regulator 100 and valve 110. The gas in this embodiment is nitrogen. Other gases such as compressed air, oxygen or an inert gas, may also be used. The valve 110 controls the gas flow at a predetermined flow rate and flow state, either continuously or intermittently.

The method according to the embodiment of the invention is as follows. Liquid 60 is evaporated by the heater 80 to form a liquid vapour. Nitrogen from gas source 90 is then released into container 70 to carry the liquid vapour onto the substrate surface through a nozzle 120. The liquid vapour beam is driven by the nitrogen out of the nozzle 120 and is jetted onto the substrate 30. Consequently, a thin liquid film 134 having a thickness of micrometer scale is then formed on the substrate surface.

The laser 10 then generates laser beam 12, which is then focussed onto the substrate 30 through the liquid film 134. Laser beam 12 begins etching the substrate surface directly according to a predetermined path. Laser beam 12 causes laser-induced sonic cavitation of the liquid film 134, thus resulting in etching of the substrate 30. This sonic cavitation effect continues until laser beam 12 evaporates the liquid film 134. Thus, the etching mechanism is laser-induced sonic cavitation, which is quite different to laser cleaning. This sonic cavitation effect is the reason for avoiding the formation of shoulder-like structures at the rim of irradiated portions of the substrate surface that occurs in dry laser etching. During the etching process, any residue material that may result from etching is carried away from the substrate 30 by the laser-induced evaporation of the liquid film 134 on the substrate surface. Thus, etched material is removed from the substrate 30, avoiding re-deposition of residue material on the substrate, which occurs in wet laser etching.

The etching process is controlled by the optical system 20 scanning laser beam 12 and stage 40 moving relative to the laser beam 12 along predetermined paths programmed into the optical system 20 and the stage 40.

Reference will now be made to several non-limiting examples of the method of the present invention.

EXAMPLE 1

Figure 2A:
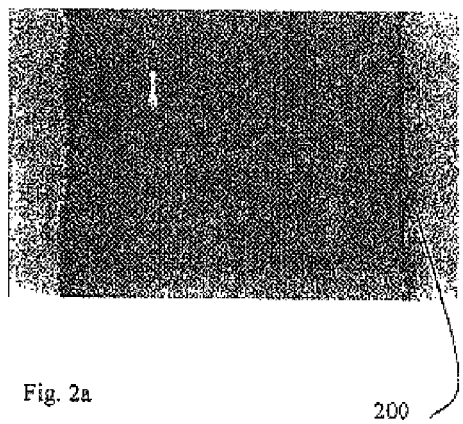
FIG. 2a is a microscope photo showing a patterned line of an ITO etched by a prior art etching method using YAG laser irradiation.
Figure 2B:
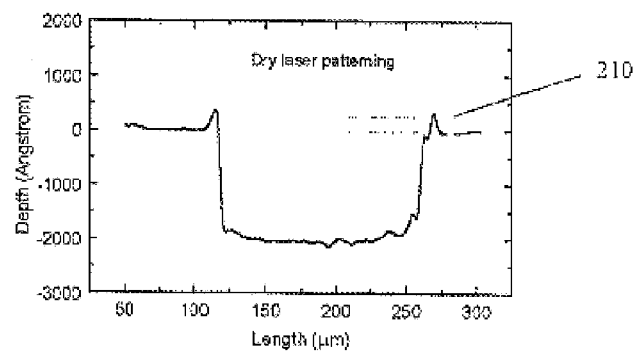

FIGS. 2a and 2b illustrate a sample of an ITO film that was etched according to the dry-laser etching method. A YAG laser was used with a wavelength of 532 nm, pulse duration of 7 ns and a repetition rate of 10 Hz. The laser fluence was 887.5 mJ/cm$^2$. As shown in FIG. 2a, a blurred borderline 200 is formed on the substrate surface. Borderline 200 corresponds to a shoulder-like structure 210 of 500 Angstroms formed at the rim of the borderline 200, as shown in FIG. 2b.

Figure 3A:
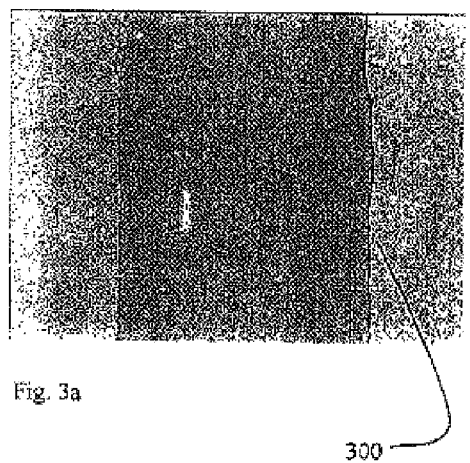
FIG. 3a is a microscope photo showing a patterned line of an ITO etched by the method according to the embodiment of the present invention using YAG laser irradiation.
Figure 3B:
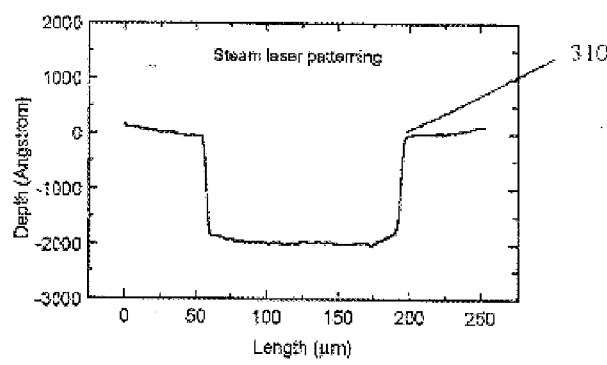

In comparison, FIGS. 3a and 3b show a sample of ITO film patterned using the method of the embodiment and the equipment set up as described above. The same laser configuration was used for patterning the ITO film sample as for the sample of FIG. 2a. As can be seen from FIG. 3a, a clear borderline 300 is obtained. This corresponds to a shoulder-free rim 310 in FIG. 3b.

EXAMPLE 2

One sample of ITO film was patterned by a prior art dry etching method and a second sample of ITO film was patterned by the method of the embodiment described above. In both samples, etching was performed by an Excimer laser with a wavelength of 248 nm, pulse duration of 23 ns, repetition rate of 30 Hz and laser fluence of 550 mJ/cm$^2$.

Figure 4A:
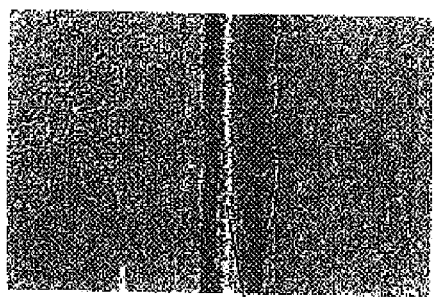
FIG. 4a is a microscope photo showing a patterned line of an ITO etched by a prior art etching method using Excimer laser irradiation.
Figure 4B:
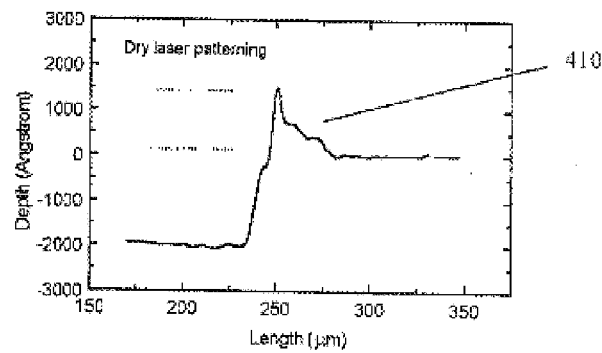

FIGS. 4a and 4b illustrates the ITO film sample etched by the prior art dry etching method. As shown in FIG. 4a, a blurred borderline 400 is formed. This corresponds to a shoulder-like structure 410 of 1500 Angstroms at the rim of borderline 400 in FIG. 4b.

Figure 5A:
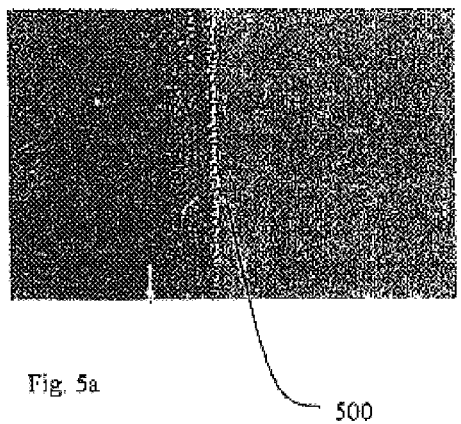
FIG. 5a is a microscope photo showing a patterned line of an ITO etched by the method according to the embodiment of the present invention using Excimer laser irradiation.
Figure 5B:
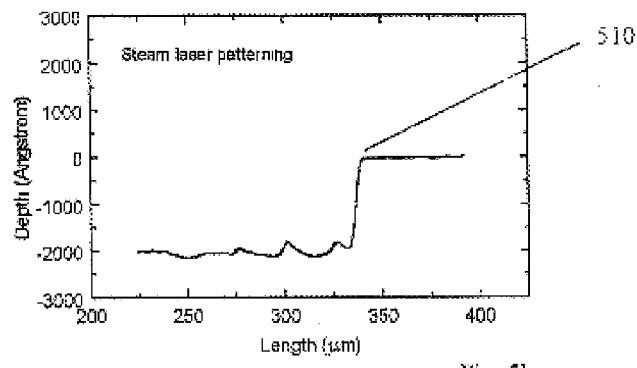

In comparison, FIGS. 5a and 5b illustrate the ITO film sample patterned by the method of the embodiment. As can be seen in FIG. 5a, a clear borderline 500 is formed at the rim of the irradiated portion of the substrate. This corresponds to a shoulder-free rim 510 in FIG. 5b.

EXAMPLE 3

Integrated circuit (IC) packages were etched. One set of IC packages was etched using the dry laser etching method and a second set was etched using the method of the embodiment described above. In both cases, a YAG laser was used with a wavelength of 532 nm and pulse duration of 7 ns.

Figure 6B:
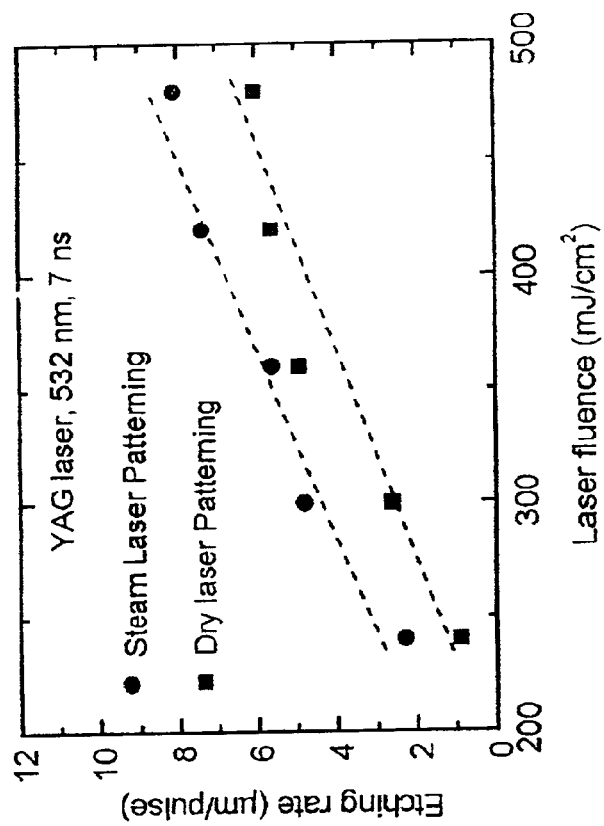
FIG. 6b shows the etching rate as a function of laser fluence for patterning of an integrated circuit package etched by a prior art etching method and the method of the embodiment of the present invention both using YAG laser irradiation.
Figure 6A:
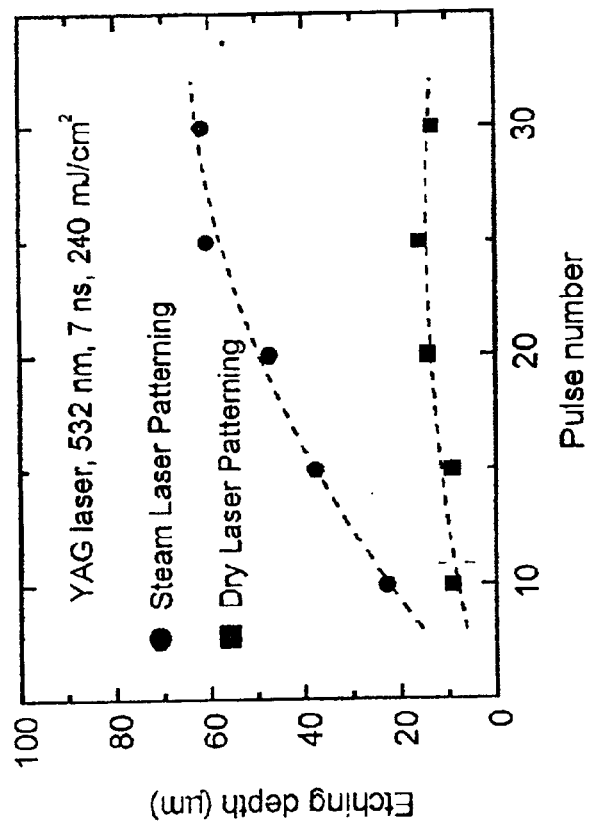
FIG. 6a shows the etching depth as a function of pulse number for patterning an integrated circuit package by a prior art etching method and the method according to the embodiment of the present invention, both using YAG laser irradiation.

In a first test, the laser fluence of the YAG laser was set at 240 mJ/cm$^2$. The etching depth of both sets of IC packages was measured against the number of pulses. The results of that test are illustrated in FIG. 6a. As can be seen in FIG. 6a, the etching depth is much higher for the method according to the embodiment of the invention than the dry laser etching method.

In a second test, the etching rate was measured for each method over a range of laser fluences between 200 and 500 mJ/cm$^2$. The results of that test are illustrated in FIG. 6b. As can be seen in FIG. 6b, the etching rate is much higher for the method according to the embodiment of the invention than the dry laser etching method.

Thus, the embodiment of the present invention provides for a method of etching a substrate which avoids the formation of shoulder-like structures at the rim of laser irradiated portions of the substrate, enhances the etching depth and etching rate, and removes any etched residue or contaminant from the surface of the substrate, preventing re-deposition of such material on the substrate. Thus, overall etching and patterning quality is improved.

Laser fluence is selected to be higher than the etching threshold of the substrate. The etching threshold depends on the parameters of the laser and material properties of the liquid film and substrate. For example, a laser fluence of more than 300 mJ/cm$^2$ is suitable for an Excimer laser patterning an ITO film, whereas a laser fluence of more than 150 mJ/cm$^2$ is suitable for a YAG laser patterning an IC package.

The foregoing describes only one embodiment of the invention and modifications can be made without departing from the scope of the invention.

What is claimed is:

1. A method of patterning a substrate according to a predetermined path, said method including forming a liquid film on the substrate surface and directing laser energy from a laser through the film to etch the substrate surface, the laser energy causing laser-induced sonic cavitation of the liquid film which etches the substrate and avoids formation of shoulder-like structures at a rim of irradiated portions of the substrate surface, wherein etched material is carried away from the substrate surface via evaporation of the film during said etching.

2. The method of claim 1, wherein the liquid film is formed on the substrate surface by jetting a liquid vapour onto the substrate surface.

3. The method of claim 2, wherein the liquid vapour comprises at least one component selected from the group consisting of water, an alcohol, an inert liquid, and a non-reactive liquid.

4. The method of claim 2, wherein the thickness of the liquid film is in the range of several micrometers to several tens of micrometers.

5. The method of claim 2, wherein the liquid vapour is jetted with a gas to carry the liquid vapour onto the substrate surface.

6. The method of claim 5, wherein the gas comprises at least one component selected from the group consisting of nitrogen, compressed air, oxygen, and an inert gas.

7. The method of claim 1, wherein the laser directs laser energy in pulses of predetermined duration.

8. The method of claim 7, wherein the pulse duration is the range of 1 to 100 ns.

9. The method of claim 1, wherein the laser fluence of the laser is more than the etching threshold of the substrate.

10. The method of claim 9, wherein the laser fluence is more than 150 mJ/cm$^2$.

11. The method of claim 1, wherein the substrate surface has an ITO film onto which the liquid film is formed.

12. The method of claim 1, wherein the substrate has one or more layers.

13. The method of claim 12, wherein at least one layer of the substrate is silicon oxide.

14. The method of claim 13, wherein the silicon oxide layer is the top layer of the substrate.

15. The method of claim 1, wherein the substrate is substantially composed of glass, quartz and/or silicon.

16. The method of claim 1, wherein the substrate is an ITO film IC package, silicon wafer, conductor, semiconductor or insulator.

* * * * *